United States Patent
Itou et al.

(10) Patent No.: US 9,960,745 B2
(45) Date of Patent: May 1, 2018

(54) NOISE FILTER AND WIRE HARNESS

(71) Applicant: Yazaki Corporation, Tokyo (JP)

(72) Inventors: Eita Itou, Shizuoka (JP); Kunihiko Yamada, Shizuoka (JP); Kentaro Kobayashi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 6 days.

(21) Appl. No.: 15/268,996

(22) Filed: Sep. 19, 2016

(65) Prior Publication Data

US 2017/0093360 A1 Mar. 30, 2017

(30) Foreign Application Priority Data

Sep. 24, 2015 (JP) ................ 2015-186698

(51) Int. Cl.
*H03H 1/00* (2006.01)
*H03H 7/01* (2006.01)
(Continued)

(52) U.S. Cl.
CPC ......... *H03H 1/0007* (2013.01); *H01B 7/0045* (2013.01); *H01F 27/29* (2013.01);
(Continued)

(58) Field of Classification Search
CPC .... H03H 1/0007; H03H 7/0115; H01F 27/29; H01B 7/0045
(Continued)

(56) References Cited

U.S. PATENT DOCUMENTS 7,470,151 B2  12/2008  Yamaguchi et al.
7,841,911 B2  11/2010  Aizawa
(Continued)

FOREIGN PATENT DOCUMENTS

CN    2294539 Y    10/1998
CN    104283522 A    1/2015
(Continued)

OTHER PUBLICATIONS

German Office Action for the related Japanese Patent Application No. 10 2016 218 117.3 dated Oct. 19, 2017.
(Continued)

*Primary Examiner* — Rakesh Patel
(74) *Attorney, Agent, or Firm* — Kenealy Vaidya LLP

(57) ABSTRACT

A noise filter includes: a capacitor-side accommodating body including capacitors, a grounding conductor connected to one electric connector, and conductors connected to the other electric connector; an inductor-side accommodating body including inductors and conductors connected to the inductors; an accommodating body connecting structure that connects the capacitor-side accommodating body to the inductor-side accommodating body by engaging a holding groove with a protrusion; a terminal connecting structure that electrically connects the capacitors to the inductors, and connects the capacitor-side accommodating body to the inductor-side accommodating body by connecting one terminal connector of a connection terminal fitting to a terminal connector of a capacitor-side conductor, and connecting the other terminal connector of the connection terminal fitting to a terminal connector of an inductor-side conductor.

5 Claims, 12 Drawing Sheets

(51) Int. Cl.
*H01B 7/00* (2006.01)
*H01F 27/29* (2006.01)
*H01G 4/228* (2006.01)

(52) U.S. Cl.
CPC ........... *H01G 4/228* (2013.01); *H03H 7/0115* (2013.01); *H01F 2027/297* (2013.01)

(58) Field of Classification Search
USPC .................................................. 333/181, 185
See application file for complete search history.

(56) References Cited

U.S. PATENT DOCUMENTS

| | | | |
|---|---|---|---|
| 7,874,851 | B2 | 1/2011 | Shimizu |
| 8,624,689 | B2 | 1/2014 | Hsieh et al. |
| 9,362,881 | B2 | 6/2016 | Aizawa |
| 2007/0270019 | A1 | 11/2007 | Yamaguchi et al. |
| 2009/0115551 | A1 | 5/2009 | Kobayashi et al. |
| 2009/0170356 | A1* | 7/2009 | Aizawa ................ H01R 31/065 439/108 |
| 2010/0178784 | A1 | 7/2010 | Shimizu |
| 2010/0271763 | A1 | 10/2010 | Kodama et al. |
| 2012/0020749 | A1 | 1/2012 | Maeda et al. |
| 2015/0008989 | A1 | 1/2015 | Aizawa |

FOREIGN PATENT DOCUMENTS

| | | |
|---|---|---|
| DE | 102007020560 A1 | 11/2007 |
| DE | 102014009175 A1 | 1/2015 |
| DE | 102010000869 B4 | 4/2015 |
| JP | 63-226107 A | 9/1988 |
| JP | 2010165784 A | 7/2010 |
| JP | 4850181 B2 | 1/2012 |
| JP | 5173859 B2 | 4/2013 |
| JP | 5371535 B2 | 12/2013 |
| JP | 5496560 B2 | 5/2014 |
| WO | 2007061046 A1 | 5/2007 |
| WO | 2010/137429 A1 | 12/2010 |

OTHER PUBLICATIONS

Chinese Office Action for the related Chinese Patent Application No. 201610842750.2 dated Feb. 26, 2018.

* cited by examiner

NOISE FILTER AND WIRE HARNESS

CROSS-REFERENCE TO RELATED APPLICATION(S)

The present application claims priority to and incorporates by reference the entire contents of Japanese Patent Application No. 2015-186698 filed in Japan on Sep. 24, 2015.

BACKGROUND OF THE INVENTION

1. Field of the Invention

The present invention relates to a noise filter and a wire harness.

2. Description of the Related Art

There has been a known noise filter that reduces electric noise on an electric circuit, a wire harness, or the like. The noise filter includes at least one noise reducing element such as a capacitor as an element that reduces noise. For example, this type of noise filter is disclosed in Japanese Patent Nos. 5496560, 5371535, 5173859, and 4850181, and International Publication No. WO 2010/137492.

Incidentally, specifications of a noise filter such as a type of noise reducing element and the number of noise reducing elements, are determined according to characteristic (frequency band or the like) of noise to be reduced. For this reason, in the noise filter, as indicated in Japanese Patent No. 4850181 and International Publication No. WO 2010/137492, an inductor other than a capacitor may be provided as the noise reducing element. The inductor includes an iron core made of metal and a coil wound around the iron core, and thus is relatively heavy in the noise filter. Therefore, when a housing accommodating the capacitor and a housing accommodating the inductor are configured as separate bodies, bond strength between the housings needs to be ensured to improve durability in this type of noise filter.

SUMMARY OF THE INVENTION

In this regard, an object of the present invention is to provide a noise filter and a wire harness, durability of which can be improved.

In order to achieve the above mentioned object, a noise filter according to one aspect of the present invention includes a capacitor-side accommodating body that includes at least one capacitor, a grounding conductor electrically connected to one electric connector of the capacitor, and a capacitor-side conductor electrically connected to the other electric connector of the capacitor; an inductor-side accommodating body that includes at least one inductor and an inductor-side conductor electrically connected to the inductor; an accommodating body connecting structure that includes a first engaging portion provided in the capacitor-side accommodating body and a second engaging portion provided in the inductor-side accommodating body, and connects the capacitor-side accommodating body to the inductor-side accommodating body by engaging the first engaging portion with the second engaging portion; and at least one terminal connecting structure that electrically connects the capacitor to the inductor, and connects the capacitor-side accommodating body to the inductor-side accommodating body by connecting one terminal connector of a connection terminal fitting to a terminal connector of the capacitor-side conductor, and connecting the other terminal connector of the connection terminal fitting to a terminal connector of the inductor-side conductor.

According to another aspect of the present invention, in the noise filter, it is desirable that one of the terminal connector of the capacitor-side conductor and the one terminal connector of the connection terminal fitting is a male tab terminal, and the other one thereof is a female box terminal, and one of the terminal connector of the inductor-side conductor and the other terminal connector of the connection terminal fitting is a male tab terminal, and the other one thereof is a female box terminal.

According to still another aspect of the present invention, in the noise filter, it is desirable that the terminal connecting structure is provided for each quantity of the capacitor.

In order to achieve the above mentioned object, a wire harness according to still another aspect of the present invention includes a noise filter; and electric wires on an input side and an output side pulled out from the noise filter, wherein the noise filter includes a capacitor-side accommodating body that includes at least one capacitor, a grounding conductor electrically connected to one electric connector of the capacitor, and a capacitor-side conductor electrically connected to the other electric connector of the capacitor, an inductor-side accommodating body that includes at least one inductor and an inductor-side conductor electrically connected to the inductor, an accommodating body connecting structure that includes a first engaging portion provided in the capacitor-side accommodating body and a second engaging portion provided in the inductor-side accommodating body, and connects the capacitor-side accommodating body to the inductor-side accommodating body by engaging the first engaging portion with the second engaging portion, and at least one terminal connecting structure that electrically connects the capacitor to the inductor, and connects the capacitor-side accommodating body to the inductor-side accommodating body by connecting one terminal connector of a connection terminal fitting to a terminal connector of the capacitor-side conductor, and connecting the other terminal connector of the connection terminal fitting to a terminal connector of the inductor-side conductor.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a detailed description will be given of an embodiment of a noise filter and a wire harness according to the present invention based on drawings. It should be noted that the invention is not restricted by the embodiment.

Embodiment

Figure 1:
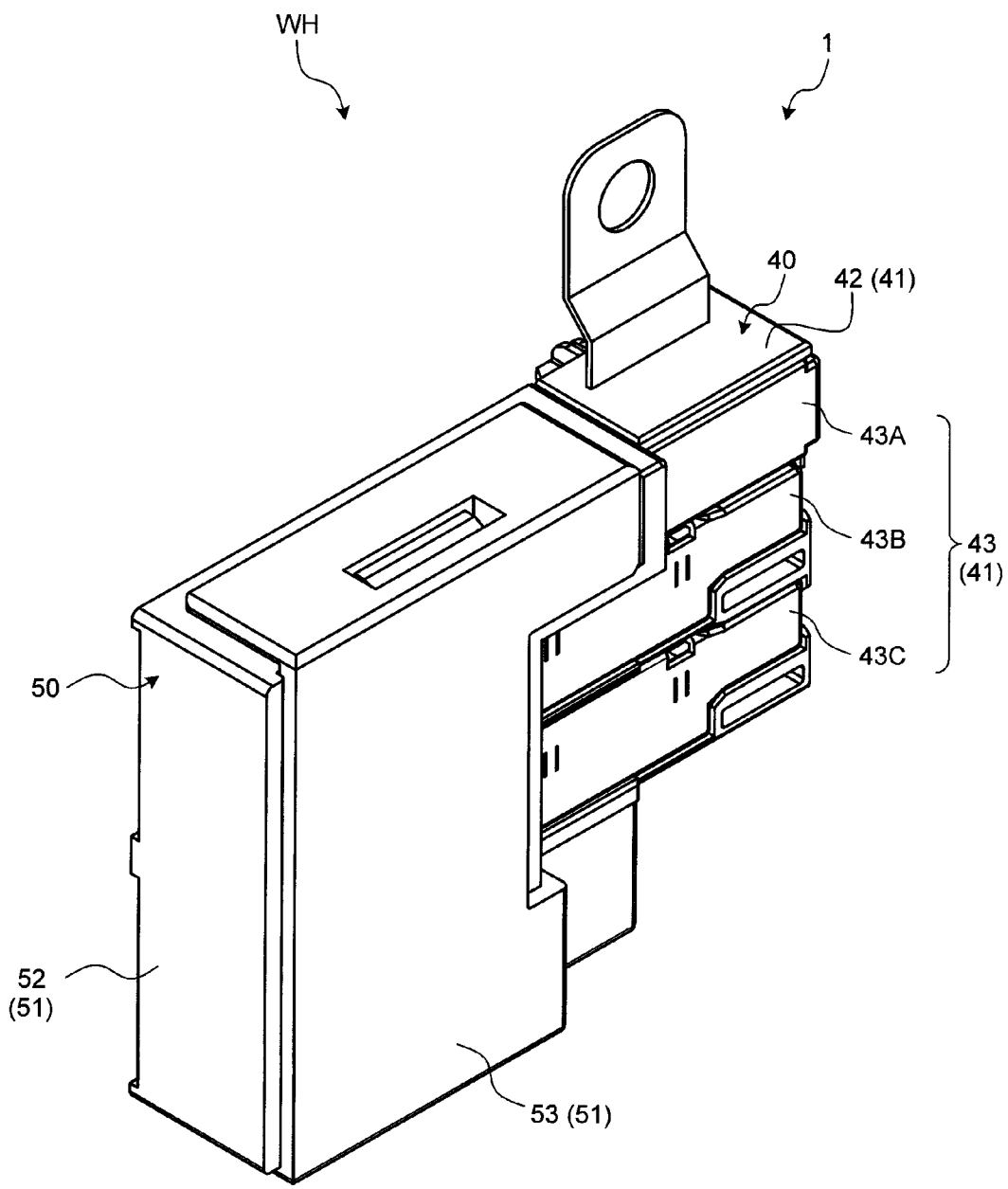
FIG. 1 is a perspective view illustrating a noise filter and a wire harness according to an embodiment.
Figure 2:
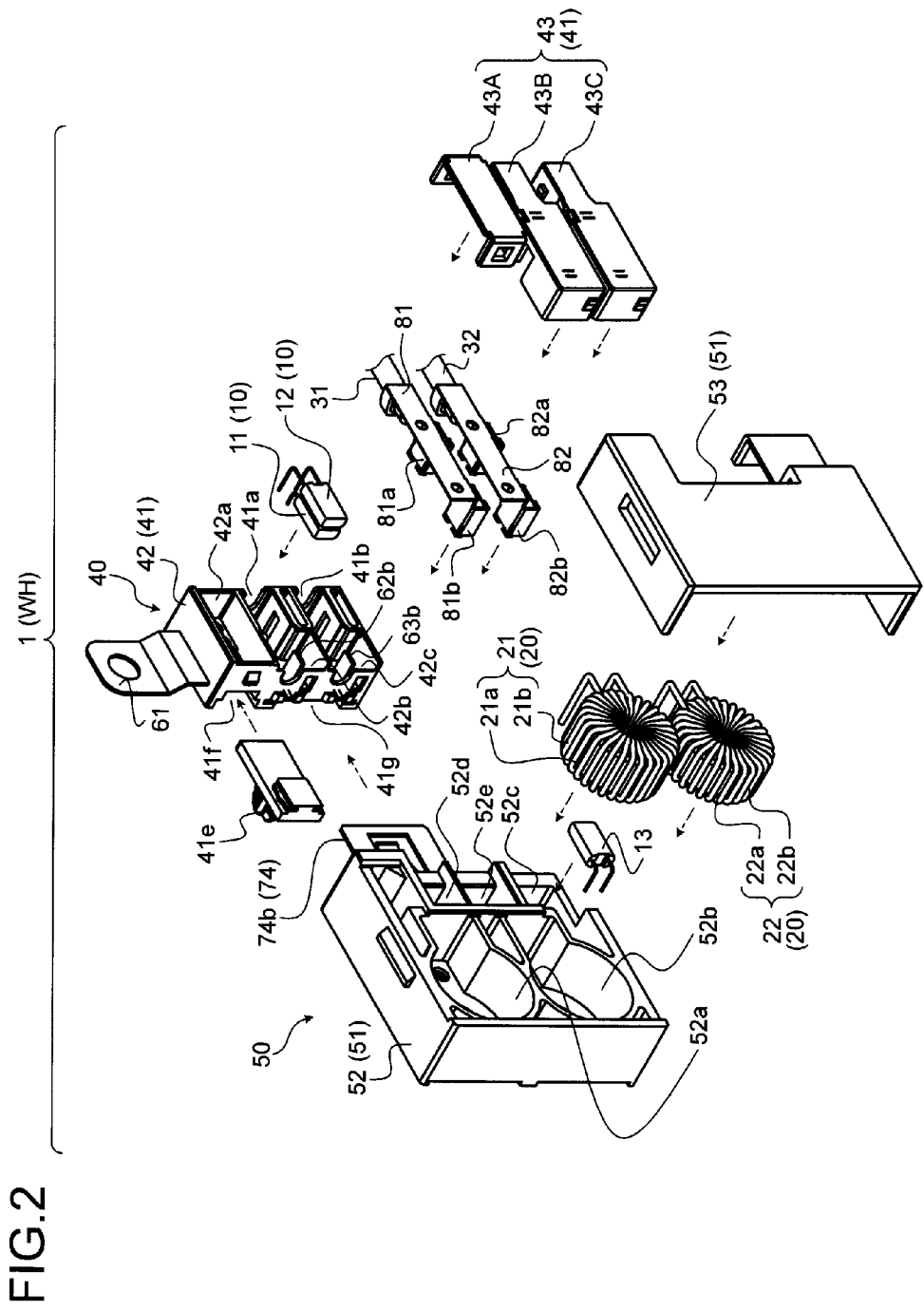
FIG. 2 is a component development view of the noise filter and the wire harness according to the embodiment.
Figure 3:
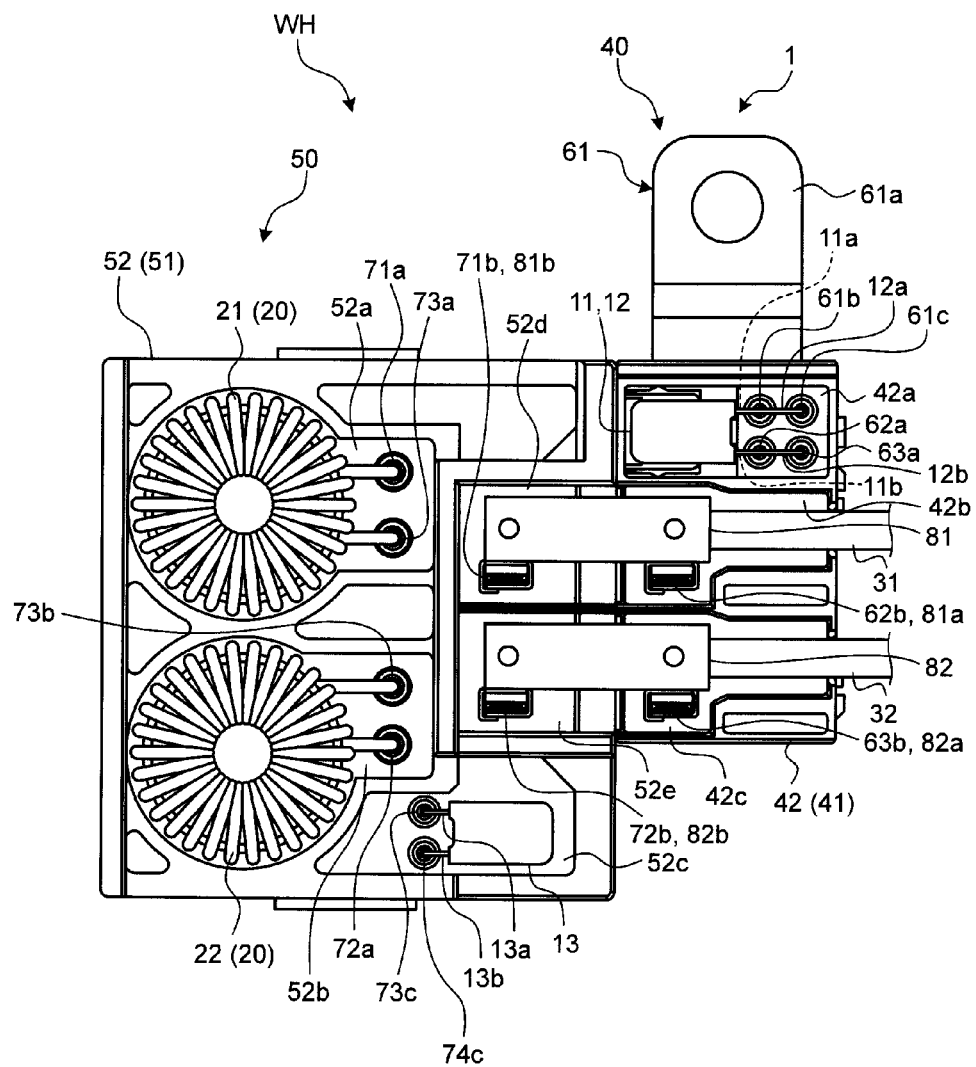
FIG. 3 is a front view in a state in which a lid portion is removed in the noise filter and the wire harness according to the embodiment.

Reference numeral 1 of FIG. 1 to FIG. 3 denotes a noise filter according to the present embodiment. In addition, a symbol WH of the respective figures denotes a wire harness according to the present embodiment. The noise filter 1 includes at least one capacitor 10 and at least one inductor 20. The noise filter 1 is connected to a first electric wire 31 and a second electric wire 32. The noise filter 1 removes noise on one of the electric wires corresponding to an input side, and outputs the noise from the other electric wire corresponding to an output side.

The noise filter 1 is broadly divided into a capacitor-side accommodating body 40 that accommodates the capacitor 10 and an inductor-side accommodating body 50 that accommodates the inductor 20. In the noise filter 1 of this example, first and second capacitors 11 and 12 are accommodated in the capacitor-side accommodating body 40, and first and second inductors 21 and 22 are accommodated in the inductor-side accommodating body 50. The first inductor 21 includes an annular shaft center (iron core) 21a and a coil 21b wounded around the shaft center 21a. The second inductor 22 includes an annular shaft center 22a and a coil 22b wounded around the shaft center 22a. A third capacitor 13 is additionally accommodated in the inductor-side accommodating body 50.

The capacitor-side accommodating body 40 includes a first housing 41 formed using an insulating material such as synthetic resin. The first housing 41 includes an accommodating portion 42 and a lid portion 43.

Figure 4:
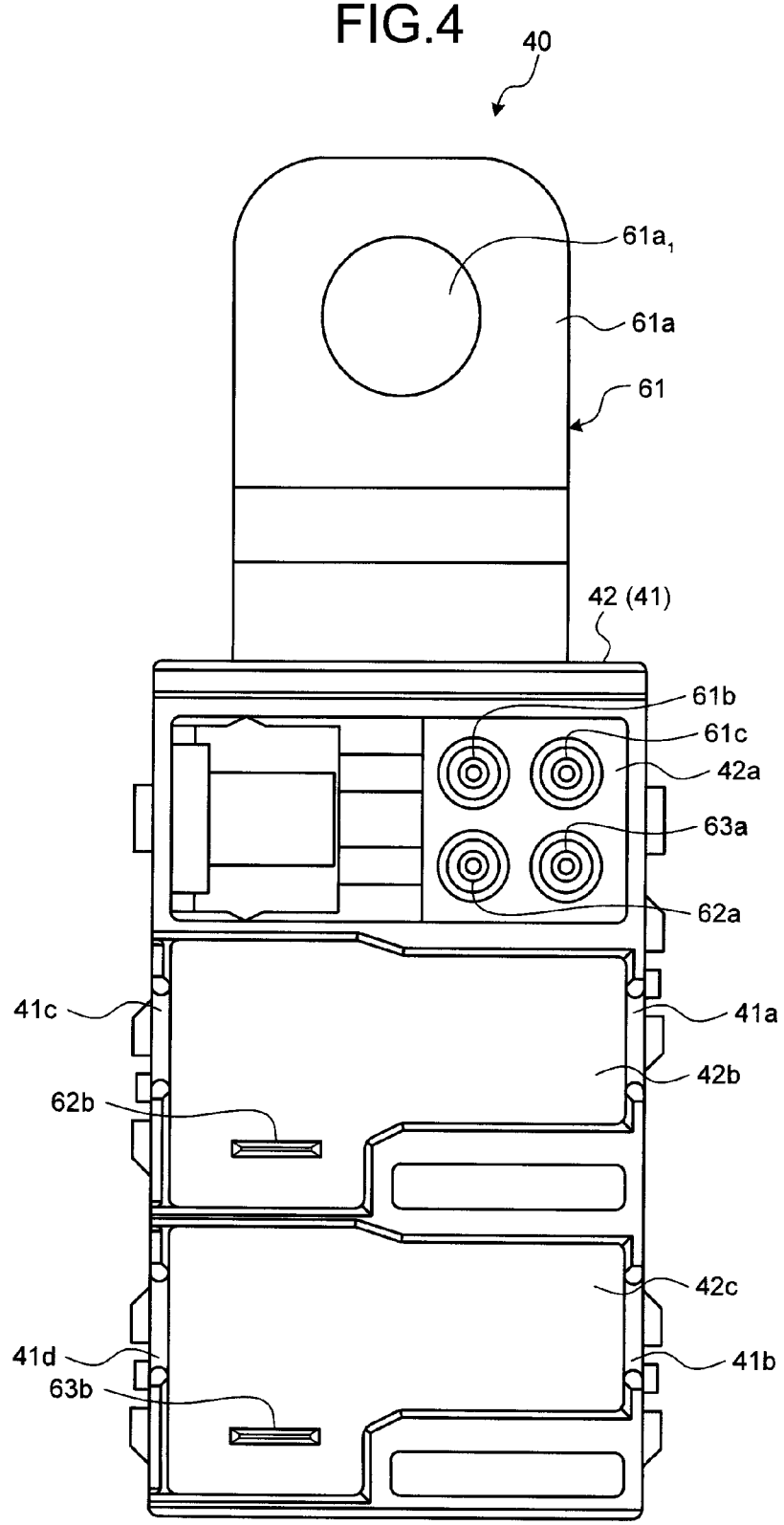
FIG. 4 is a front view in the state in which the lid portion is removed in a capacitor-side accommodating body according to the embodiment.

The accommodating portion 42 is molded in a box shape, one surface of which is opened. The accommodating portion 42 of this example is molded in a shape of a rectangular parallelepiped. The accommodating portion 42 is provided with a capacitor accommodating chamber 42a in which the first and second capacitors 11 and 12 are superposed and accommodated, a first terminal accommodating chamber 42b in which one terminal connector 81a of a first connection terminal fitting 81 described below is accommodated together with the first electric wire 31, and a second terminal accommodating chamber 42c in which one terminal connector 82a of a second connection terminal fitting 82 described below is accommodated together with the second electric wire 32 (FIG. 4). The capacitor accommodating chamber 42a, the first terminal accommodating chamber 42b, and the second terminal accommodating chamber 42c are disposed side by side in order in a longitudinal direction of the accommodating portion 42.

An insertion hole 41a for pulling the first electric wire 31 out from the first terminal accommodating chamber 42b, and an insertion hole 41b for pulling the second electric wire 32 out from the second terminal accommodating chamber 42c are formed in the first housing 41 (the accommodating portion 42) (FIG. 2 and FIG. 4). Although not used in this example, an insertion hole 41c for pulling an electric wire (not illustrated) out from the first terminal accommodating chamber 42b at a position facing the insertion hole 41a in a short direction of the accommodating portion 42, and an insertion hole 41d for pulling an electric wire (not illustrated) out from the second terminal accommodating chamber 42c at a position facing the insertion hole 41b in the short direction thereof are formed in the first housing 41 (the accommodating portion 42).

The lid portion 43 is provided with a first lid portion 43A that blocks an opening of the capacitor accommodating chamber 42a, a second lid portion 43B that blocks an opening of the first terminal accommodating chamber 42b, and a third lid portion 43C that blocks an opening of the second terminal accommodating chamber 42c (FIG. 1).

Figure 5:
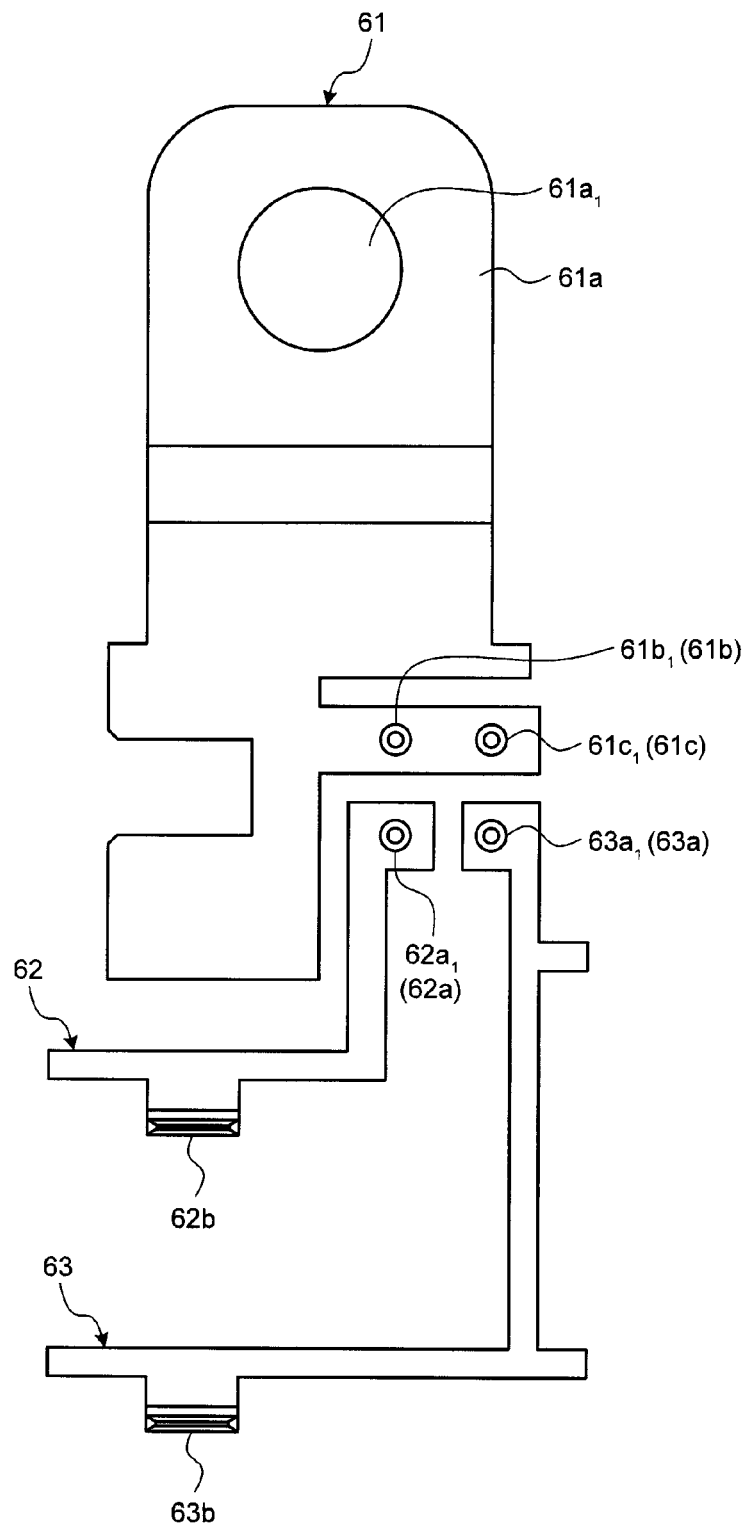
FIG. 5 is a front view illustrating a grounding conductor, a first conductor, and a second conductor in the capacitor-side accommodating body according to the embodiment.

Further, the accommodating portion 42 includes a grounding conductor 61, a first conductor 62, and a second conductor 63 (FIG. 5). Each of the grounding conductor 61, the first conductor 62, and the second conductor 63 is molded as a bus bar corresponding to a compact of a plate-shaped conductive material (metallic material or the like). The accommodating portion 42 is subjected to insert molding together with the grounding conductor 61, the first conductor 62, and the second conductor 63.

The grounding conductor 61 includes a contact portion 61a that comes in electrical contact with a conductive member (not illustrated) such as a vehicle body, and is grounded through the contact portion 61a. In the capacitor-side accommodating body 40, the contact portion 61a is exposed to the outside of the first housing 41. A through-hole $61a_1$ formed in the contact portion 61a is a hole into which a male screw portion (not illustrated) is inserted. The capacitor-side accommodating body 40 (the noise filter 1) is screwed to the conductive member through the through-hole $61a_1$.

Further, the grounding conductor 61 includes a first ground-side connector 61b electrically connectable to one electric connector 11a of the first capacitor 11, and a second ground-side connector 61c electrically connectable to one electric connector 12a of the second capacitor 12. The first ground-side connector 61b and the second ground-side connector 61c of this example are exposed to the capacitor accommodating chamber 42a, and are disposed in parallel at a predetermined interval in the short direction of the accommodating portion 42. In the grounding conductor 61, the contact portion 61a is disposed at an interval in the longitudinal direction of the accommodating portion 42 with respect to the first and second ground-side connectors 61b and 61c.

The electric connector 11a and the first ground-side connector 61b may be electrically connected to each other using a method widely known in this technical field. For example, the electric connector 11a and the first ground-side connector 61b are electrically connected to each other using soldering or welding. The electric connector 12a and the second ground-side connector 61c are similarly connected to each other. The first ground-side connector 61b and the second ground-side connector 61c of this example include a through-hole $61b_1$ and a through-hole $61c_1$, respectively. The electric connector 11a and the electric connector 12a are inserted into the through-holes $61b_1$ and $61c_1$, and are electrically connected through soldering and the like.

The first conductor 62 includes a capacitor connector 62a electrically connectable to the other electric connector 11b of the first capacitor 11. In addition, the second conductor 63 includes a capacitor connector 63a electrically connectable to the other electric connector 12b of the second capacitor 12. The capacitor connector 62a and the capacitor connector 63a are exposed to the capacitor accommodating chamber 42a, and are disposed in parallel at a predetermined interval in the short direction of the accommodating portion 42. Further, in the first conductor 62, the capacitor connector 62a is disposed side by side in the longitudinal direction of the accommodating portion 42 with respect to the first ground-side connector 61b. In addition, in the second conductor 63, the capacitor connector 63a is disposed side by side in the longitudinal direction of the accommodating portion 42 with respect to the second ground-side connector 61c. Therefore, in the capacitor-side accommodating body 40, the first capacitor 11 is first connected to the grounding conductor 61 and the first conductor 62, and then the second capacitor 12 is connected to the grounding conductor 61 and the second conductor 63 while being superposed onto the first capacitor 11.

The electric connector 11b and the capacitor connector 62a may be electrically connected to each other using a method widely known in this technical field. For example, the electric connector 11b and the capacitor connector 62a are electrically connected to each other using soldering or welding. The electric connector 12b and the capacitor connector 63a are similarly connected to each other. The capacitor connectors 62a and 63a of this example include through-holes $62a_1$ and $63a_1$, respectively. The electric connector 11b and the electric connector 12b are inserted into the through-holes $62a_1$ and $63a_1$, and are electrically connected through soldering and the like.

Further, the first conductor 62 includes a terminal connector 62b exposed to the first terminal accommodating chamber 42b. The terminal connector 62b protrudes in an orthogonal direction with respect to a plate-shaped surface in a main body of the first conductor 62, and is electrically connected to the terminal connector 81a of the first connection terminal fitting 81 described below. One of the terminal connectors 62b and 81a is formed in a male tab shape, and the other one is formed in a female box shape. In this example, the terminal connector 62b is set as a male tab terminal, and the terminal connector 81a is set as a female box terminal.

In addition, the second conductor 63 includes a terminal connector 63b exposed to the second terminal accommodating chamber 42c. The terminal connector 63b protrudes in an orthogonal direction with respect to a plate-shaped surface in a main body of the second conductor 63, and is electrically connected to the terminal connector 82a of the second connection terminal fitting 82 described below. One of the terminal connectors 63b and 82a is formed in a male tab shape, and the other one is formed in a female box shape. In this example, the terminal connector 63b is set as a male tab terminal, and the terminal connector 82a is set as a female box terminal.

Figure 6:
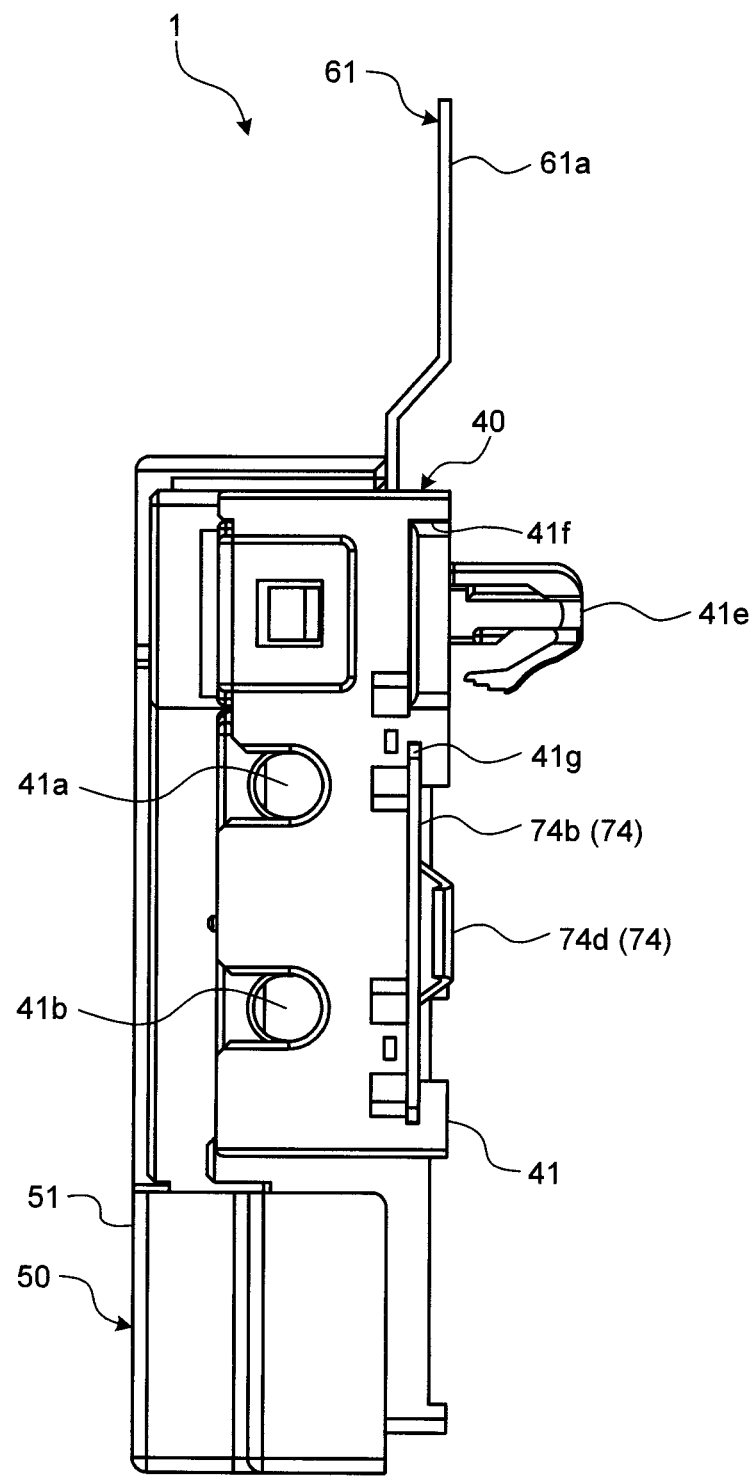
FIG. 6 is a side view of the capacitor-side accommodating body according to the embodiment.

Herein, in the noise filter 1, a case in which only screwing through the through-hole $61a_1$ of the grounding conductor 61 is used may cause a position shift in a rotation direction with respect to the conductive member (vehicle body) around the through-hole $61a_1$. In this regard, a locking portion 41e for stopping rotation with respect to the conductive member is provided in the first housing 41 (FIG. 2 and FIG. 6). The locking portion 41e is a clip inserted into a through-hole (not illustrated) of the conductive member, and held in the through-hole. The locking portion 41e of this example is inserted up to a predetermined position along a holding groove 41f formed on a rear surface of the accommodating portion 42, and is held in the holding groove 41f.

Next, the inductor-side accommodating body 50 will be described. The inductor-side accommodating body 50 includes a second housing 51 molded using an insulating material such as synthetic resin. The second housing 51 includes an accommodating portion 52 and a lid portion 53 (FIG. 2).

Figure 7:
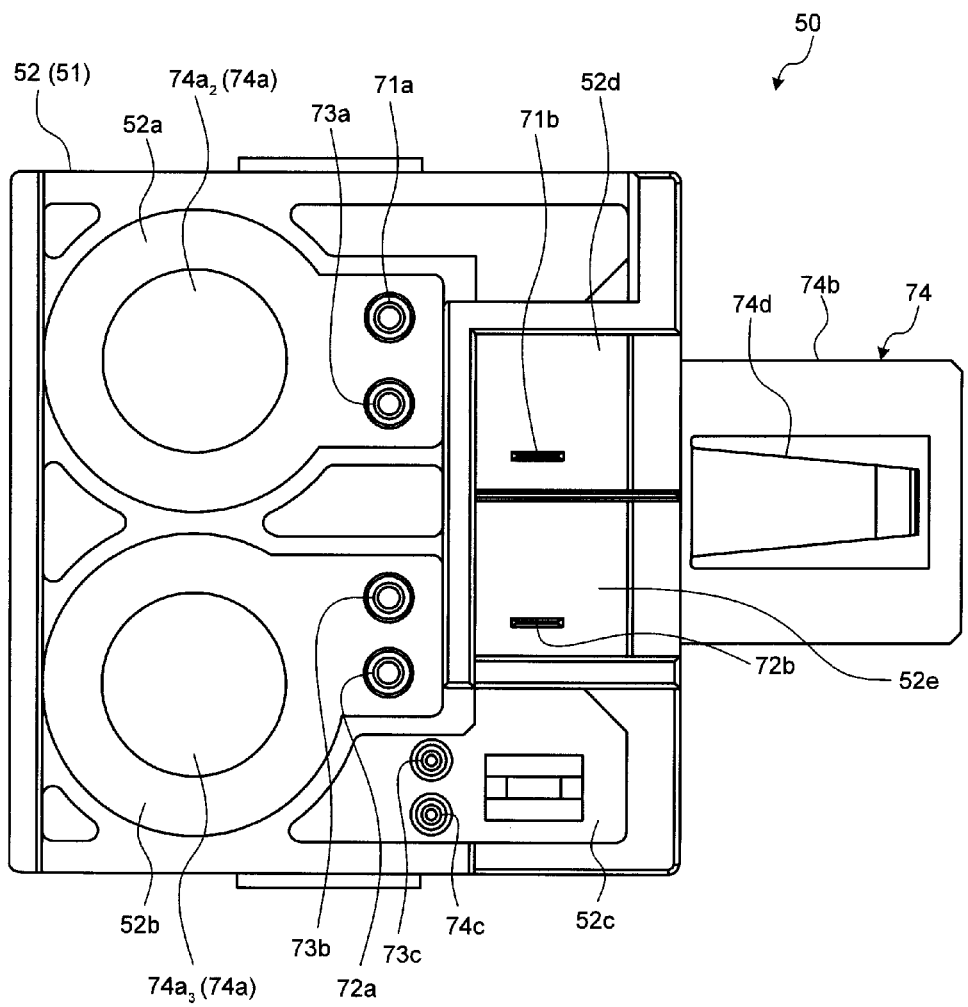
FIG. 7 is a front view in the state in which the lid portion is removed in an inductor-side accommodating body according to the embodiment.

The accommodating portion 52 is molded in a box shape, one surface of which is opened. The accommodating portion 52 of this example is molded in a parallelepiped shape. The accommodating portion 52 is provided with a first inductor accommodating chamber 52a that accommodates the first inductor 21, a second inductor accommodating chamber 52b that accommodates the second inductor 22, and a capacitor accommodating chamber 52c that accommodates the third capacitor 13 (FIG. 3 and FIG. 7). The first inductor accommodating chamber 52a and the second inductor accommodating chamber 52b are formed in cylindrical shapes in accordance with annular shapes of the first inductor 21 and the second inductor 22. The lid portion 53 is molded to block openings of the first inductor accommodating chamber 52a, the second inductor accommodating chamber 52b, and the capacitor accommodating chamber 52c.

Further, the accommodating portion 52 is provided with a first terminal accommodating chamber 52d that accommodates the other terminal connector 81b of the first connection terminal fitting 81 described below, and a second terminal accommodating chamber 52e that accommodates the other terminal connector 82b of the second connection terminal fitting 82 described below. In the noise filter 1, the terminal accommodating chambers are disposed such that the first terminal accommodating chamber 42b is adjacent to the first terminal accommodating chamber 52d, and the second terminal accommodating chamber 42c is adjacent to the second terminal accommodating chamber 52e when the capacitor-side accommodating body 40 is connected to the inductor-side accommodating body 50 (FIG. 3). Therefore, in the noise filter 1, the second lid portion 43B blocks an opening of the first terminal accommodating chamber 52d, and the third lid portion 43C blocks an opening of the second terminal accommodating chamber 52e.

Figure 8:
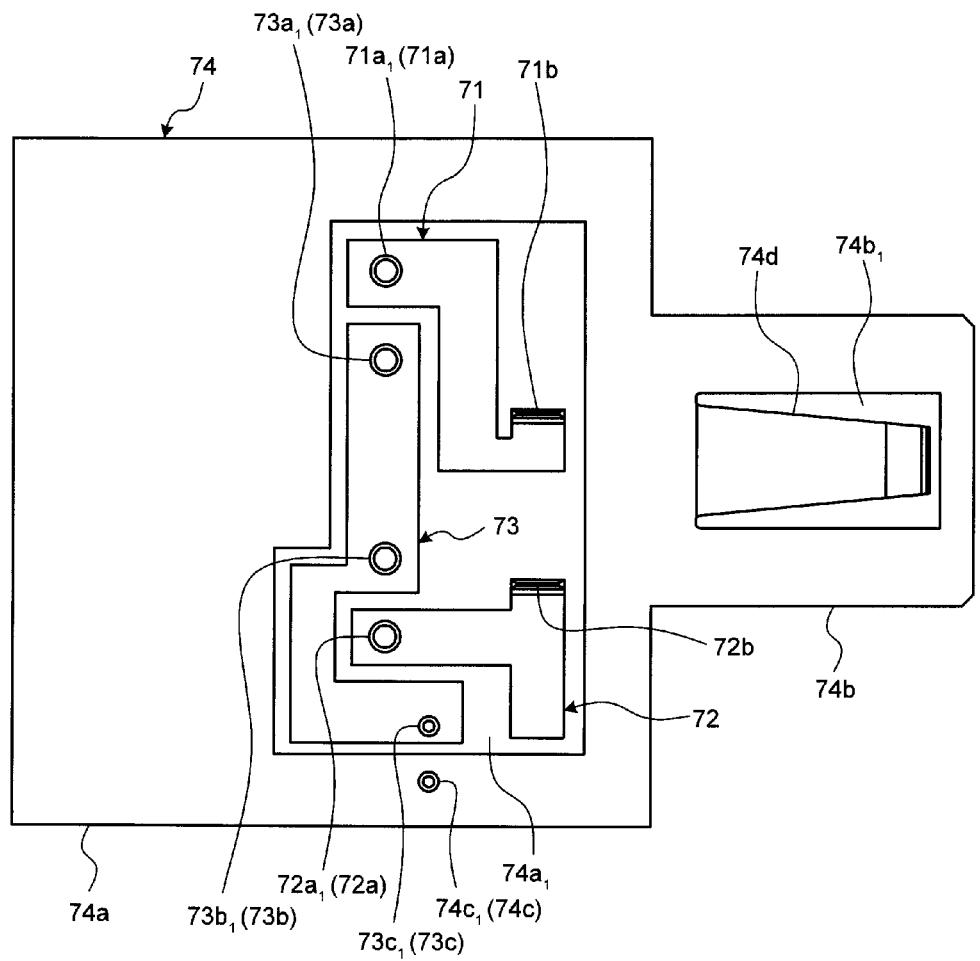
FIG. 8 is a front view illustrating a first conductor, a second conductor, a third conductor, and a heat radiating plate in the inductor-side accommodating body according to the embodiment.

The accommodating portion 52 is provided with a first conductor 71, a second conductor 72, a third conductor 73, and a heat radiating plate 74 (FIG. 8). Each of the first conductor 71, the second conductor 72, and the third conductor 73 is molded as a bus bar corresponding to a compact of a plate-shaped conductive material (metallic material or the like). In addition, the heat radiating plate 74 is molded using a plate-shaped conductive material (metallic material or the like). A metallic material (copper plate or the like) having high thermal conductivity is used for the heat radiating plate 74. The first conductor 71, the second conductor 72, the third conductor 73, and the heat radiating plate 74 are disposed on the same plane. The accommodating portion 52 is subjected to insert molding together with the first conductor 71, the second conductor 72, the third conductor 73, and the heat radiating plate 74.

Figure 9:
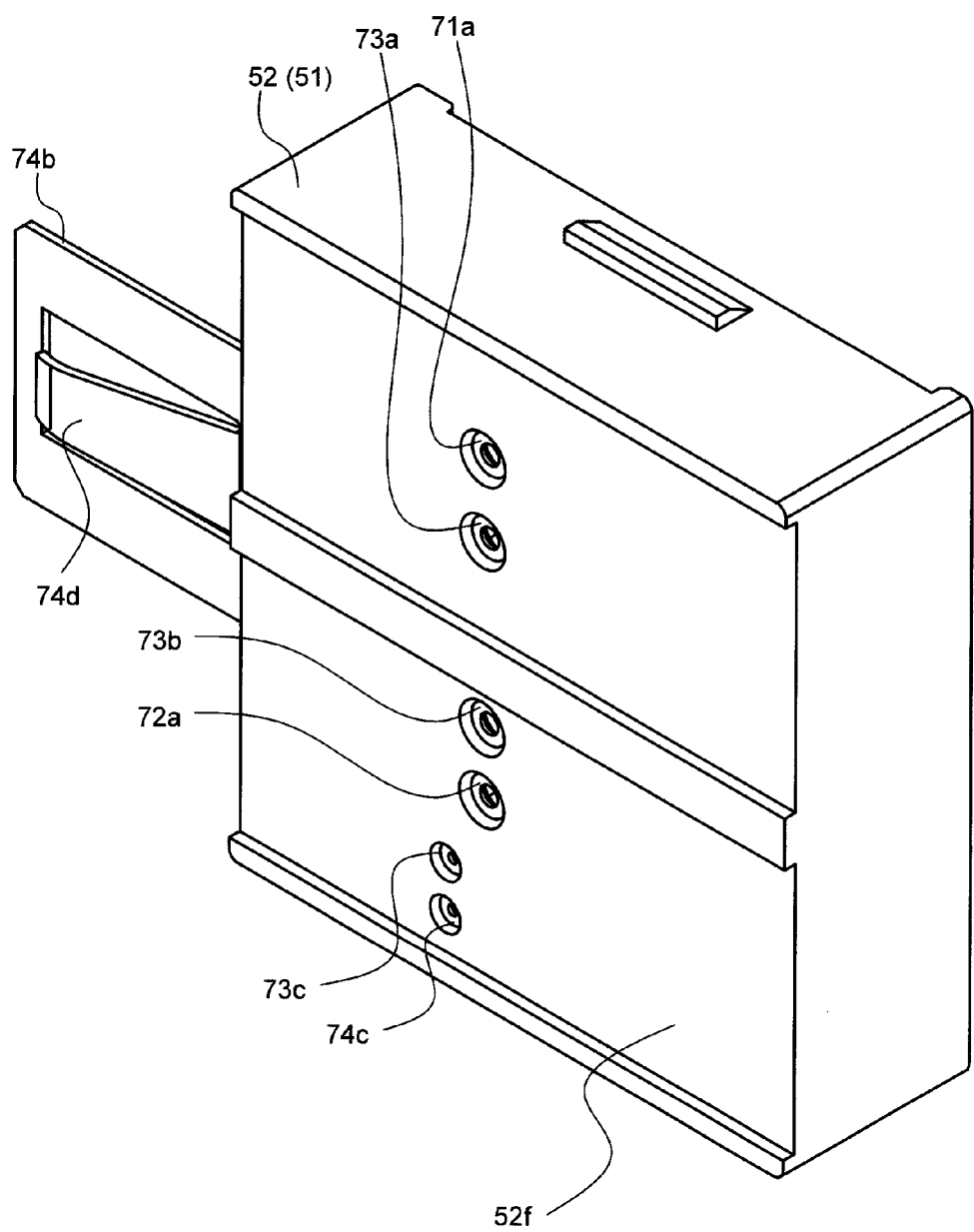
FIG. 9 is a perspective view of the inductor-side accommodating body viewed from a rear side according to the embodiment.

The first conductor 71 includes an inductor connector 71a electrically connectable to one end of the coil 21b in the first inductor 21. The second conductor 72 includes an inductor connector 72a electrically connectable to one end of the coil 22b in the second inductor 22. The third conductor 73 includes an inductor connector 73a electrically connectable to the other end of the coil 21b in the first inductor 21, and an inductor connector 73b electrically connectable to the other end of the coil 22b in the second inductor 22. Similarly to the capacitor 10, for example, these electric connections are performed using soldering or the like through through-holes $71a_1$, $72a_1$, $73a_1$, and $73b_1$. The inductor connectors 71a and 73a involved in the first inductor 21 are exposed to the first inductor accommodating chamber 52a and the outside of the accommodating portion 52 (FIG. 7 and FIG. 9). The inductor connectors 72a and 73b involved in the second inductor 22 are exposed to the second inductor accommodating chamber 52b and the outside of the accommodating portion 52.

In addition, the first conductor 71 includes a terminal connector 71b exposed to the first terminal accommodating chamber 52d. The terminal connector 71b protrudes in an orthogonal direction with respect to a plate-shaped surface in a main body of the first conductor 71, and is electrically connected to the terminal connector 81b of the first connection terminal fitting 81 described below. One of the terminal connectors 71b and 81b is formed in a male tab shape, and the other one is formed in a female box shape. In this example, the terminal connector 71b is set as a male tab terminal, and the terminal connector 81b is set as a female box terminal.

In addition, the second conductor 72 includes a terminal connector 72b exposed to the second terminal accommodating chamber 52e. The terminal connector 72b protrudes in an orthogonal direction with respect to a plate-shaped surface in a main body of the second conductor 72, and is electrically connected to the terminal connector 82b of the second connection terminal fitting 82 described below. One of the terminal connectors 72b and 82b is formed in a male tab shape, and the other one is formed in a female box shape. In this example, the terminal connector 72b is set as a male tab terminal, and the terminal connector 82b is set as a female box terminal.

In addition, the third conductor 73 includes a capacitor connector 73c electrically connectable to one electric connector 13a of the third capacitor 13. The other electric connector 13b of the third capacitor 13 is electrically connected to a capacitor connector 74c of the heat radiating plate 74 described below. Similarly to the first capacitor 11 and the like, for example, theses electric connections are performed using soldering or the like through through-holes $73c_1$ and $74c_1$. The capacitor connectors 73c and 74c are exposed to the capacitor accommodating chamber 52c and the outside of the accommodating portion 52 (FIG. 7 and FIG. 9).

The heat radiating plate 74 includes a plate-shaped main body 74a which is present across the entire surface of a wall portion 52f of the accommodating portion 52 (FIG. 9), and a plate-shaped protrusion 74b protruding from the accommodating portion 52 on the same plane as that of the main body 74a (FIG. 7 to FIG. 9). In this example, each of the main body 74a and the protrusion 74b is formed in a rectangular shape. In addition, in this example, a protruding direction of the protrusion 74b is a direction in which the inductor-side accommodating body 50 is connected to the capacitor-side accommodating body 40.

A through-hole $74a_1$ is formed in the main body 74a (FIG. 8). The first conductor 71, the second conductor 72, and the third conductor 73 are disposed at intervals in the through-hole $74a_1$. The main body 74a includes a first exposed portion $74a_2$ exposed to the first inductor accommodating chamber 52a, and a second exposed portion $74a_3$ exposed to the second inductor accommodating chamber 52b (FIG. 7). The first exposed portion $74a_2$ and the second exposed portion $74a_3$ are formed in circular shapes in accordance with the annular shapes of the first inductor 21 and the second inductor 22. The first inductor 21 and the second inductor 22 are disposed at intervals from the first exposed portion $74a_2$ and the second exposed portion $74a_3$. The first exposed portion $74a_2$ can take away heat of air of the first inductor accommodating chamber 52a. The second exposed portion $74a_3$ can take away heat of air of the second inductor accommodating chamber 52b.

The capacitor connector 74c electrically connectable to the other electric connector 13b of the third capacitor 13 is formed in the main body 74a.

The protrusion 74b is used as a connector for connecting the inductor-side accommodating body 50 to the capacitor-side accommodating body 40. A holding groove 41g into which the protrusion 74b is inserted and held in the protruding direction is formed in the first housing 41 (the accommodating portion 42) (FIG. 2 and FIG. 6). Each of two side portions facing each other in the protrusion 74b is fit to the holding groove 41g. The capacitor-side accommodating body 40 and the inductor-side accommodating body 50 are connected by the protrusion 74b and the holding groove 41g. For this reason, in the noise filter 1, a fitting force (holding force) between the protrusion 74b and the holding groove 41g is set such that a bonded state is not released due to vibration or an input from the vehicle body after attachment to the vehicle body.

Further, in the noise filter 1, strength of the heat radiating plate 74 (at least the protrusion 74b) is ensured such that the heat radiating plate 74 (specifically, the protrusion 74b) is not deformed due to vibration or an input from the vehicle body after attachment to the vehicle body. For example, a plate thickness of the heat radiating plate 74 (at least the protrusion 74b) is set such that such deformation does not occur.

Furthermore, the capacitor-side accommodating body 40 and the inductor-side accommodating body 50 are connected by the first connection terminal fitting 81 and the second connection terminal fitting 82 (FIG. 2 and FIG. 3). The first connection terminal fitting 81 and the second connection terminal fitting 82 are molded by performing folding and the like on a plate-shaped conductive material (a metallic material or the like).

The first connection terminal fitting 81 includes a terminal connector 81a electrically connectable to the terminal connector 62b of the first conductor 62 in the capacitor-side accommodating body 40, and a terminal connector 81b electrically connectable to the terminal connector 71b of the first conductor 71 in the inductor-side accommodating body 50. The first electric wire 31 is electrically connected to the first connection terminal fitting 81 through crimping and the like. The first connection terminal fitting 81 is a structure which not only electrically connects the first capacitor 11 to the first inductor 21, but also joins the capacitor-side accommodating body 40 and the inductor-side accommodating body 50.

The second connection terminal fitting 82 includes the terminal connector 82a electrically connectable to the terminal connector 63b of the second conductor 63 in the capacitor-side accommodating body 40, and the terminal connector 82b electrically connectable to the terminal connector 72b of the second conductor 72 in the inductor-side accommodating body 50. The second electric wire 32 is electrically connected to the second connection terminal fitting 82 through crimping and the like. The second connection terminal fitting 82 is a structure which not only electrically connects the second capacitor 12 to the second inductor 22, but also joins the capacitor-side accommodating body 40 and the inductor-side accommodating body 50.

As described above, the noise filter 1 and the wire harness WH of the present embodiment includes a accommodating body connecting structure using the holding groove 41g of the capacitor-side accommodating body 40 and the protrusion 74b of the inductor-side accommodating body 50, a first terminal connecting structure between the first conductor 62 of the capacitor-side accommodating body 40 and the first conductor 71 of the inductor-side accommodating body 50 through the first connection terminal fitting 81, and a second terminal connecting structure between the second conductor 63 of the capacitor-side accommodating body 40 and the second conductor 72 of the inductor-side accommodating body 50 through the second connection terminal fitting 82. For this reason, in the noise filter 1 and the wire harness WH, the capacitor-side accommodating body 40 is strongly connected to the inductor-side accommodating body 50. For example, even when an input such as vibration is applied during conveyance to a vehicle assembly factory or during driving after attachment to the vehicle body, release of the connection is suppressed, and durability of the connection part is improved. In this way, the noise filter 1 can be reliably mounted in the vehicle.

In addition, in the noise filter 1 and the wire harness WH of the present embodiment, strong bond strength can be obtained between the capacitor-side accommodating body 40 and the inductor-side accommodating body 50. Thus, even when the noise filter 1 is fixed to the vehicle body at only one place corresponding to the through-hole $61a_1$ of the grounding conductor 61, release of connection between the capacitor-side accommodating body 40 and the inductor-side accommodating body 50 is suppressed. In other words, the noise filter 1 and the wire harness WH can strongly connect the capacitor-side accommodating body 40 to the inductor-side accommodating body 50 without increasing man-hours in assembling with the vehicle body.

Incidentally, the above-described holding groove 41g is formed such that one plate-shaped surface of the protrusion 74b is exposed to the outside of the first housing 41 (the accommodating portion 42). For this reason, the heat radiating plate 74 can radiate heat to the outside air from the protrusion 74b. The one plate-shaped surface of the protrusion 74b is present on the same side as that of a contact area with respect to the vehicle body in the contact portion 61a of the grounding conductor 61. In this example, when the contact portion 61a is attached to the vehicle body, the plate-shaped surface of the protrusion 74b faces the vehicle body at an interval.

Herein, a through-hole $74b_1$ is formed in the protrusion 74b (FIG. 8). A cantilever leaf spring portion 74d is provided in the through-hole $74b_1$. The leaf spring portion 74d is allowed to protrude from an end portion of the through-hole $74b_1$ on the main body 74a side in the protruding direction of the protrusion 74b toward the vehicle body which faces the one plate-shaped surface of the protrusion 74b (FIG. 6 and FIG. 9). For this reason, the leaf spring portion 74d protrudes to the vehicle body side from the one plate-shaped surface of the protrusion 74b. When the contact portion 61a is attached to the vehicle body, the leaf spring portion 74d is pushed from the vehicle body and tilted using a root side as a fulcrum, and a contact state with respect to the vehicle body is maintained by a repulsive force generated at this time. For this reason, the heat radiating plate 74 can release heat of the protrusion 74b to the vehicle body through the leaf spring portion 74d.

In this noise filter 1, in response to turning on electricity, heat generated in the first inductor 21 is transferred to air of the first inductor accommodating chamber 52a, and heat generated in the second inductor 22 is transferred to air of the second inductor accommodating chamber 52b. In addition, in this noise filter 1, heat of the air of the first inductor accommodating chamber 52a is mainly transferred to the first exposed portion $74a_2$ of the heat radiating plate 74, and heat of the air of the second inductor accommodating chamber 52b is mainly transferred to the second exposed portion $74a_3$ of the heat radiating plate 74. Heat of the first and second exposed portions $74a_2$ and $74a_3$ diffuses in the main body 74a of the heat radiating plate 74 mainly due to heat leveling effect, and is transferred to the protrusion 74b and the leaf spring portion 74d. Heat is radiated to surrounding air from the protrusion 74b and the leaf spring portion 74d. Further, heat is radiated to the vehicle body from the leaf spring portion 74d. For this reason, in this noise filter 1, it is possible to suppress temperature rises of the first inductor 21 and the second inductor 22.

In addition, in this noise filter 1, since the main body 74a of the heat radiating plate 74 is present across the entire surface of the wall portion 52f of the accommodating portion 52, heat of the main body 74a is transferred to the wall portion 52f coming into contact with the main body 74a, and a heat diffusion time is required more than in the main body 74a. However, heat is diffused in the wall portion 52f and radiated to the outside of the accommodating portion 52. Further, in this noise filter 1, heat is radiated from both ends of the coil 21b of the first inductor 21 to the first conductor 71 and the third conductor 73, and heat is radiated from both ends of the coil 22b of the second inductor 22 to the second conductor 72 and the third conductor 73. Heat of the first to third conductors 71, 72, and 73 is transferred to the wall portion 52f with which the respective conductors come into contact, and a heat diffusion time is required more than in the main body 74a. However, heat is diffused in the wall portion 52f and radiated to the outside of the accommodating portion 52. For this reason, in this noise filter 1, even when heat is transferred through these heat transfer paths, it is possible to suppress temperature rises of the first inductor 21 and the second inductor 22.

As described above, the noise filter 1 of the present embodiment not only diffuses heat of an inductor through a conventional coil, but also diffuses a lot of heat through the heat radiating plate 74 that accounts for a large proportion of a wall of the accommodating portion 52. For this reason, this noise filter 1 can appropriately suppress temperature rises of the first inductor 21 and the second inductor 22. In addition, in this way, this noise filter 1 can suppress a decrease in durability due to the temperature rises of the first inductor 21 and the second inductor 22. Further, this noise filter 1 may not use the first inductor 21 and the second inductor 22, heat resisting temperatures of which are excessively high, and thus can attempt a cost reduction. Furthermore, the wire harness WH having this noise filter 1 can obtain the same effect as that obtained by this noise filter 1.

Herein, in the first inductor accommodating chamber 52a and the second inductor accommodating chamber 52b, each of the first inductor 21 and the second inductor 22 is exposed to indoor air. For this reason, heat radiated from the first inductor 21 and the second inductor 22 is affected by thermal conductivity of the air. In other words, the first inductor 21 and the second inductor 22 more easily radiate heat as thermal conductivity of an object coming into contact with the first inductor 21 and the second inductor 22 is higher.

Figure 10:
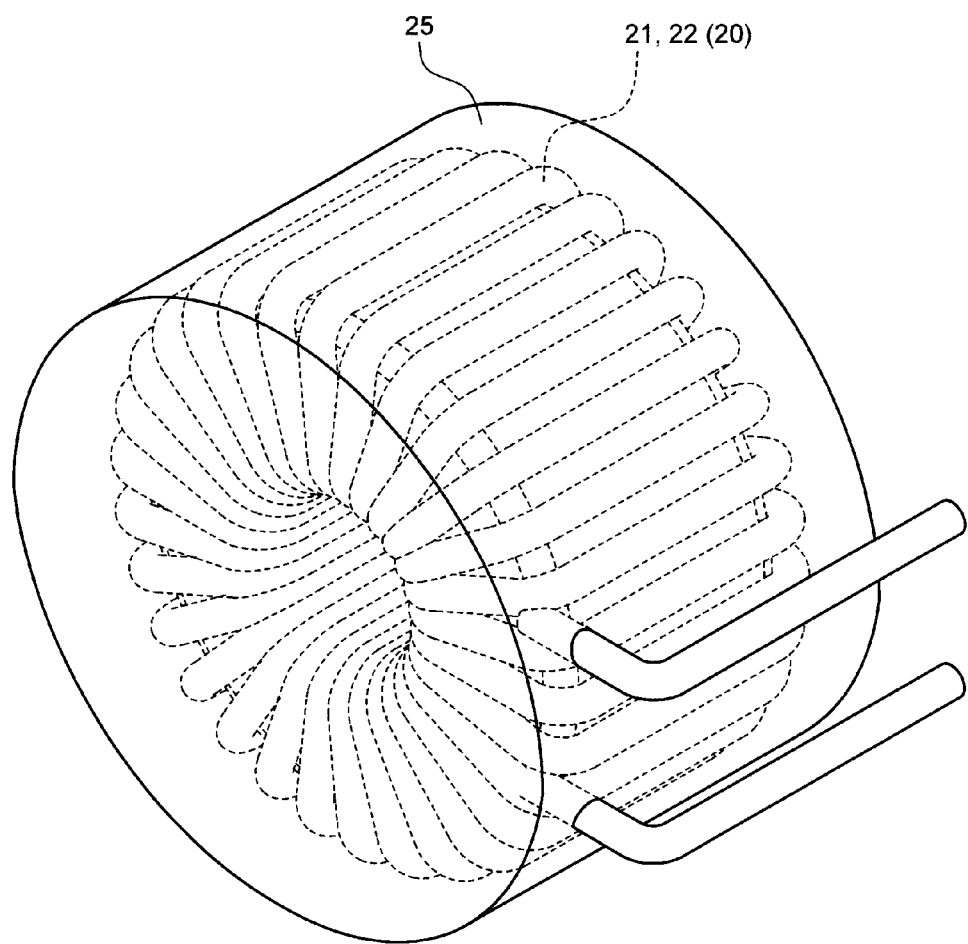
FIG. 10 is a perspective view illustrating a modified example of an inductor and a high-thermal conductive member in the embodiment.

In this regard, it is desirable to increase heat radiation effect by embedding the first inductor 21 and the second inductor 22 in an insulating high-thermal conductive member 25 having higher thermal conductivity than that of air except for contact point portions (both ends) of the coils 21b and 22b, and allowing the entire outer wall surface except for the contact point portions to come into contact with the high-thermal conductive member 25 (FIG. 10). For example, the high-thermal conductive member 25 is molded by disposing the first inductor 21 or the second inductor 22 in a resin mold, a bisected internal space of which is a cylinder, and filling the internal space with a potting material having high thermal conductivity, an insulating property, and a thermal resistance. Examples of the potting material may include urethane resin, a plastic material or a ceramic material to which various fillers are added, glass, asphalt, concrete, and the like. The potting material may be appropriately selected depending on a physical size, a radiation amount, and the like of the first inductor 21 or the second inductor 22.

Figure 11:
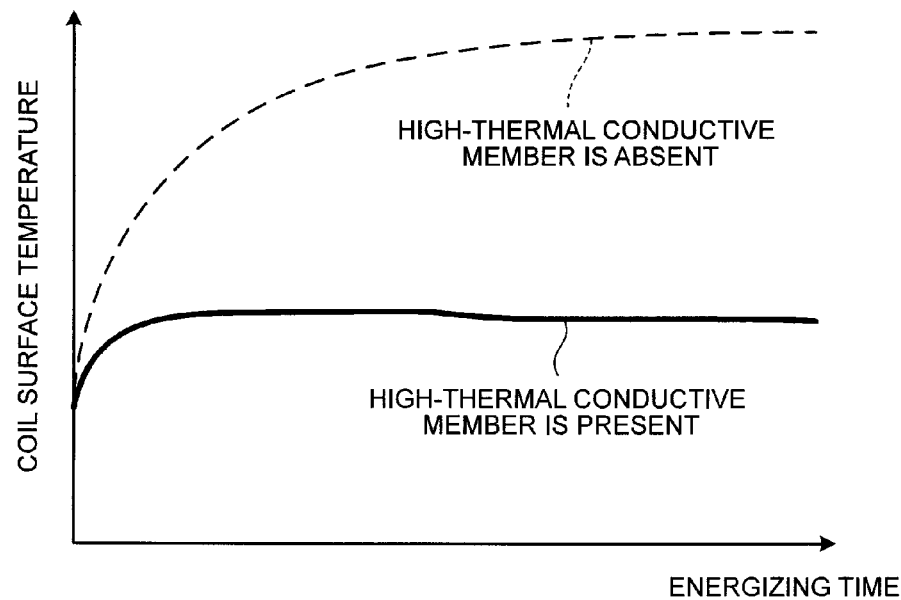
FIG. 11 is a diagram explaining a coil surface temperature depending on the presence/absence of the high-thermal conductive member.

FIG. 11 illustrates a relation between an energizing time with respect to the first inductor 21 or the second inductor 22 and surface temperatures of the coils 21b and 22b. In this figure, a solid line indicate a case in which the high-thermal conductive member 25 is included, and a broken line indicates a case in which the high-thermal conductive member 25 is not included (that is, a case in which the first inductor 21 or the second inductor 22 is exposed to air). According to this figure, it is understood that temperature rises of the coils 21b and 22b are suppressed by providing the high-thermal conductive member 25 when compared to a case in which the first inductor 21 and the second inductor 22 are directly exposed to air. Therefore, this noise filter 1 can further suppress the temperature rises of the first inductor 21 and the second inductor 22 by providing the high-thermal conductive member 25.

Application Example

The above-described configuration is an example of the noise filter 1, and the noise filter 1 is configured as a joined body obtained by joining the capacitor-side accommodating body 40 having at least one capacitor 10 to the inductor-side accommodating body 50 having at least one inductor 20. The capacitor-side accommodating body 40 further includes the grounding conductor 61 electrically connected to one electric connector of the capacitor 10 (the electric connector 11a of the first capacitor 11 and the electric connector 12a of the second capacitor 12), and a capacitor-side conductor (the first conductor 62 and the second conductor 63) electrically connected to the other electric connector of the capacitor 10 (the electric connector 11b of the first capacitor 11 and the electric connector 12b of the second capacitor 12). An electric wire (the first electric wire 31 and the second electric wire 32) is electrically connected to the capacitor-side conductor (the first conductor 62 and the second conductor 63). In addition, the inductor-side accommodating body 50 further includes an inductor-side conductor (the first conductor 71 and the second conductor 72) electrically connected to the inductor 20 (the first inductor 21 and the second inductor 22).

In addition, this noise filter 1 includes the accommodating body connecting structure and at least one terminal connecting structure for the joining. The accommodating body connecting structure connects the capacitor-side accommodating body 40 to the inductor-side accommodating body 50 by engaging a first engaging portion (for example, the above-described holding groove 41g) in the capacitor-side accommodating body 40 with a second engaging portion (for example, the above-described protrusion 74b) in the inductor-side accommodating body 50. It is desirable to provide the terminal connecting structure for each quantity of the capacitor 10. The terminal connecting structure electrically connects the capacitor 10 to the inductor 20, and connects the capacitor-side accommodating body 40 to the inductor-side accommodating body 50 by connecting one terminal connector of the connection terminal fitting (the terminal connector 81a of the first connection terminal fitting 81 and the terminal connector 82a of the second connection terminal fitting 82) to a terminal connector of the capacitor-side conductor (the terminal connector 62b of the first conductor 62 and the terminal connector 63b of the second conductor 63), and connecting the other terminal connector of the connection terminal fitting (the terminal connector 81b of the first connection terminal fitting 81 and the terminal connector 82b of the second connection terminal fitting 82) to a terminal connector of the inductor-side conductor (the terminal connector 71b of the first conductor 71 and the terminal connector 72b of the second conductor 72).

For example, this noise filter 1 may be connected to a ground wire of a defogger of a vehicle (the first electric wire 31 and the second electric wire 32), and used to remove noise on a signal of a radio (due to a radio wave of on-board equipment). This noise filter 1 in this case requires attenuation corresponding to a predetermined attenuation amount in a predetermined band of the radio. However, in this noise filter 1, at least portions of the first electric wire 31 and the second electric wire 32 travel side by side, and a parasitic inductance increases by a distance in which the portions travel side by side. Therefore, a resonance point is shifted, and thus the attenuation amount in the predetermined band decreases.

Figure 12:
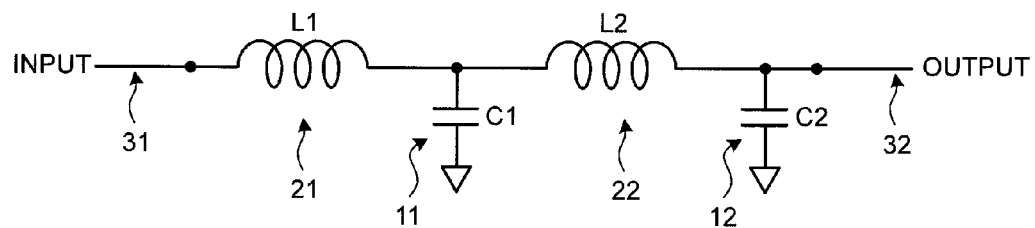
FIG. 12 is a diagram illustrating an LCLC circuit configuration.

In this regard, this noise filter 1 builds a circuit configuration (LCLC circuit configuration) illustrated in FIG. 12 using the first and second capacitors 11 and 12 and the first and second inductors 21 and 22, and establishes this circuit configuration as below, thereby obtaining an attenuation characteristic in which attenuation corresponding to a predetermined attenuation amount is allowed in the predetermined band even when the first electric wire 31 and the second electric wire 32 travel side by side.

This noise filter 1 uses the first and second capacitors 11 and 12 having different capacitances C1 and C2. One of the capacitance C1 of the first capacitor 11 and the capacitance C2 of the second capacitor 12 may be large. For example, herein, the capacitance C1 of the first capacitor 11 is set to be smaller than the capacitance C2 of the second capacitor 12 (C1<C2). As described above, in this noise filter 1, an attenuation characteristic, which cannot be actualized when the first and second capacitors 11 and 12 having the same capacitances C1 and C2 are used, can be obtained by changing the respective capacitances C1 and C2 of the first and second capacitors 11 and 12. Therefore, the capacitance C1 of the first capacitor 11 and the capacitance C2 of the second capacitor 12 are determined depending on a desired attenuation characteristic between the first electric wire 31 on an input side and the second electric wire 32 on an output side.

Further, this noise filter 1 uses the first and second inductors 21 and 22 having larger inductances L1 and L2 than a parasitic inductance Lp due to the first electric wire 31 and the second electric wire 32 traveling side by side (L1>Lp, L2>Lp). For example, herein, the inductance L1 of the first inductor 21 is set to be larger than the inductance L2 of the second inductor 22 (L1>L2). In this noise filter 1, it is possible to cancel an influence on an attenuation characteristic associated with an increase in parasitic inductance Lp depending on a distance in which the first electric wire 31 and the second electric wire 32 travel side by side by setting the inductances L1 and L2 of the first and second inductors 21 and 22 to be larger than the parasitic inductance Lp. Therefore, the inductances L1 and L2 of the first and second inductors 21 and 22 are determined after obtaining a minimum difference with respect to the parasitic inductance Lp such that a desired attenuation characteristic is obtained even when the parasitic inductance Lp increases due to the first electric wire 31 and the second electric wire 32 traveling side by side.

Figure 13:
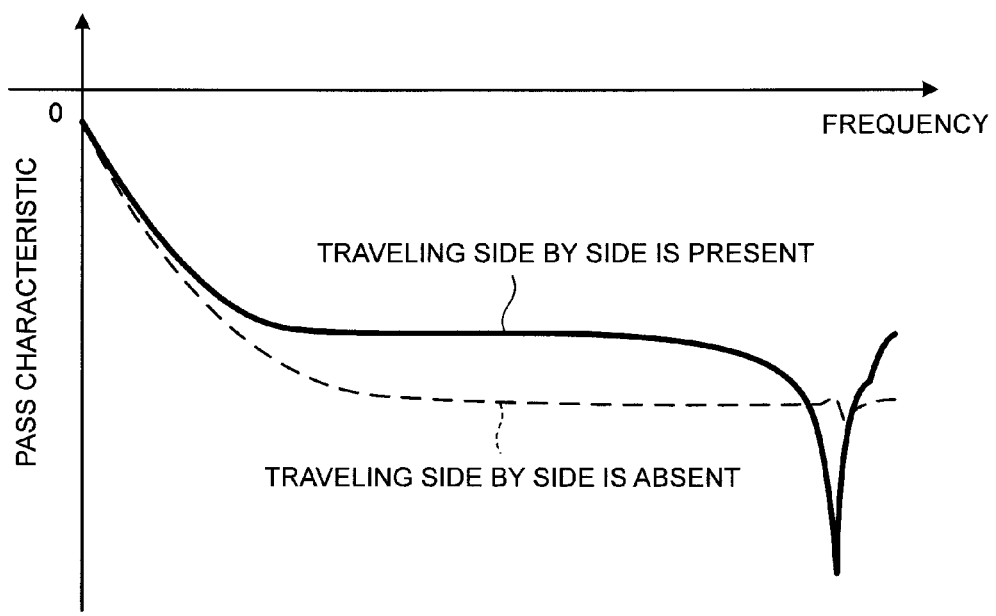
FIG. 13 is a diagram illustrating a pass characteristic for each frequency.

This noise filter 1 can obtain a desired attenuation characteristic in which attenuation corresponding to a predetermined attenuation amount is allowed in a predetermined band through the above setting (FIG. 13). FIG. 13 illustrates a pass characteristic for each frequency of a radio. This figure represents a case (broken line) in which the first electric wire 31 and the second electric wire 32 do not travel side by side, and a case (solid line) in which the traveling side by side continues over a predetermined distance.

In a noise filter and a wire harness according to the embodiment, a capacitor-side accommodating body and an inductor-side accommodating body can be strongly connected to each other using a accommodating body connecting structure and at least one terminal connecting structure. For this reason, it is possible to improve durability of a connection part of the noise filter and the wire harness.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A noise filter comprising:
   a capacitor-side accommodating body that includes at least one capacitor, a grounding conductor electrically connected to one electric connector of the at least one capacitor, and a capacitor-side conductor electrically connected to another electric connector of the at least one capacitor;
   an inductor-side accommodating body that includes at least one inductor and an inductor-side conductor electrically connected to the at least one inductor;
   an accommodating body connecting structure that includes a first engaging portion provided in the capacitor-side accommodating body and a second engaging portion provided in the inductor-side accommodating body, and connects the capacitor-side accommodating body to the inductor-side accommodating body by engaging the first engaging portion with the second engaging portion; and
   at least one terminal connecting structure that electrically connects the at least one capacitor to the at least one inductor, and connects the capacitor-side accommodating body to the inductor-side accommodating body by connecting one terminal connector of a connection terminal fitting to a terminal connector of the capacitor-side conductor, and connecting another terminal connector of the connection terminal fitting to a terminal connector of the inductor-side conductor.

2. The noise filter according to claim 1, wherein
   one of the terminal connector of the capacitor-side conductor and the one terminal connector of the connection terminal fitting is a male tab terminal, and the other one thereof is a female box terminal, and
   one of the terminal connector of the inductor-side conductor and the other terminal connector of the connection terminal fitting is a male tab terminal, and the other one thereof is a female box terminal.

3. The noise filter according to claim 1, wherein
   the terminal connecting structure is provided for each ones of the at least one capacitor.

4. The noise filter according to claim 2, wherein
   the terminal connecting structure is provided for each ones of the at least one capacitor.

5. A wire harness comprising:
   a noise filter; and
   electric wires on an input side and an output side thereof, the electric wires are pulled out from the noise filter, wherein
   the noise filter includes
   a capacitor-side accommodating body that includes at least one capacitor, a grounding conductor electrically connected to one electric connector of the at least one capacitor, and a capacitor-side conductor electrically connected to another electric connector of the at least one capacitor,
   an inductor-side accommodating body that includes at least one inductor and an inductor-side conductor electrically connected to the at least one inductor,
   an accommodating body connecting structure that includes a first engaging portion provided in the capacitor-side accommodating body and a second engaging portion provided in the inductor-side accommodating body, and connects the capacitor-side accommodating body to the inductor-side accommodating body by engaging the first engaging portion with the second engaging portion, and
   at least one terminal connecting structure that electrically connects the at least one capacitor to the at least one inductor, and connects the capacitor-side accommodating body to the inductor-side accommodating body by connecting one terminal connector of a connection terminal fitting to a terminal connector of the capacitor-side conductor, and connecting another terminal connector of the connection terminal fitting to a terminal connector of the inductor-side conductor.

* * * * *